United States Patent
Viswanathan

(10) Patent No.: US 9,984,951 B2
(45) Date of Patent: May 29, 2018

(54) SINTERED MULTILAYER HEAT SINKS FOR MICROELECTRONIC PACKAGES AND METHODS FOR THE PRODUCTION THEREOF

(71) Applicant: FREESCALE SEMICONDUCTOR INC., Austin, TX (US)

(72) Inventor: Lakshminarayan Viswanathan, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 0 days. days.

(21) Appl. No.: 15/223,307

(22) Filed: Jul. 29, 2016

(65) Prior Publication Data

US 2018/0033716 A1  Feb. 1, 2018

(51) Int. Cl.
    H01L 23/373    (2006.01)
    H01L 21/48     (2006.01)
    H01L 23/00     (2006.01)
    B22F 7/08      (2006.01)

(52) U.S. Cl.
    CPC ...... *H01L 23/3735* (2013.01); *H01L 21/4882* (2013.01); *H01L 23/3736* (2013.01); *H01L 24/83* (2013.01); *B22F 7/08* (2013.01); *H01L 24/32* (2013.01); *H01L 24/49* (2013.01); *H01L 24/73* (2013.01); *H01L 2224/32245* (2013.01); *H01L 2224/48091* (2013.01); *H01L 2224/48106* (2013.01); *H01L 2224/48175* (2013.01); *H01L 2224/73265* (2013.01)

(58) Field of Classification Search
    CPC .................. H01L 23/3735; H01L 21/4882
    See application file for complete search history.

(56) References Cited

U.S. PATENT DOCUMENTS

| | | | |
|---|---|---|---|
| 8,822,036 B1 | 9/2014 | Wereszczak | |
| 9,099,567 B2 | 8/2015 | Viswanathan et al. | |
| 2007/0172990 A1 | 7/2007 | Abdo et al. | |
| 2013/0216848 A1 | 8/2013 | Kalich et al. | |
| 2014/0231815 A1* | 8/2014 | Railkar | H01L 24/83 257/76 |
| 2015/0115451 A1 | 4/2015 | Viswanathan | |
| 2015/0306669 A1* | 10/2015 | Guenther | B22F 1/0062 156/89.16 |
| 2015/0348865 A1* | 12/2015 | Vincent | H01L 24/03 257/712 |

* cited by examiner

Primary Examiner — Errol Fernandes

(57) ABSTRACT

Methods for producing multilayer heat sinks utilizing low temperature sintering processes are provided. In one embodiment, the method includes forming a metal particle-containing precursor layer over a first principal surface of a first metal layer. The first metal layer and the metal particle-containing layer are then arranged in a stacked relationship with a second metal layer such that the precursor layer is disposed between the first and second metal layers. A low temperature sintering process is then carried-out at a maximum process temperature less than a melt point of the metal particles to transform the precursor layer into a sintered bond layer joining the first and second metal layers in a sintered multilayer heat sink. In embodiments wherein the sintered multilayer heat sink is contained within a heat sink panel, singulation may be carried-out to separate the sintered multilayer heat sink from the other heat sinks within the panel.

20 Claims, 4 Drawing Sheets

SINTERED MULTILAYER HEAT SINKS FOR MICROELECTRONIC PACKAGES AND METHODS FOR THE PRODUCTION THEREOF

TECHNICAL FIELD

Embodiments of the present invention relate generally to microelectronic packaging and, more particularly, to methods for producing multilayer heat sinks utilizing low temperature metal sintering processes, as well as to microelectronic packages and sintered multilayer heat sinks produced by such methods.

BACKGROUND

Multilayer heat sinks are now commonly incorporated into high performance microelectronic packages prone to excess heat generation during operation. Generally, a multilayer heat sink is produced by bonding multiple metallic layers in a stacked or laminated configuration. The composition and number of metal layers are chosen to impart the multilayer heat sink with a relatively high thermal conductivity suited for heat dissipation purposes, while further imparting the heat sink with an effective Coefficient of Thermal Expansion (CTE) more closely matched to the microelectronic device or devices (e.g., semiconductor die) supported by the heat sink. To provide a more specific example, a multilayer heat sink might include an upper copper (Cu) layer, a lower Cu layer, and an intervening layer disposed between the upper and lower Cu layers. The intervening layer is composed of a metallic material having a CTE less than that of the Cu layers, such as molybdenum (Mo) or a copper-molybdenum (Cu—Mo) alloy. By virtue of the inclusion of the intervening Mo or Cu—Mo layer, the effective CTE of the multilayer heat sink may be lowered to reduce mechanical stresses occurring within the microelectronic package (particularly, at the heat sink-die attach interface) through thermal cycling. Concurrently, the overall thermal conductivity and, thus, the heat dissipation characteristics of the multilayer heat sink may remain comparable to that of a monolithic heat sink wholly composed of Cu, a Cu-based alloy, or a similar material.

BRIEF DESCRIPTION OF THE DRAWINGS

At least one example of the present invention will hereinafter be described in conjunction with the following figures, wherein like numerals denote like elements, and.

Figure 1:
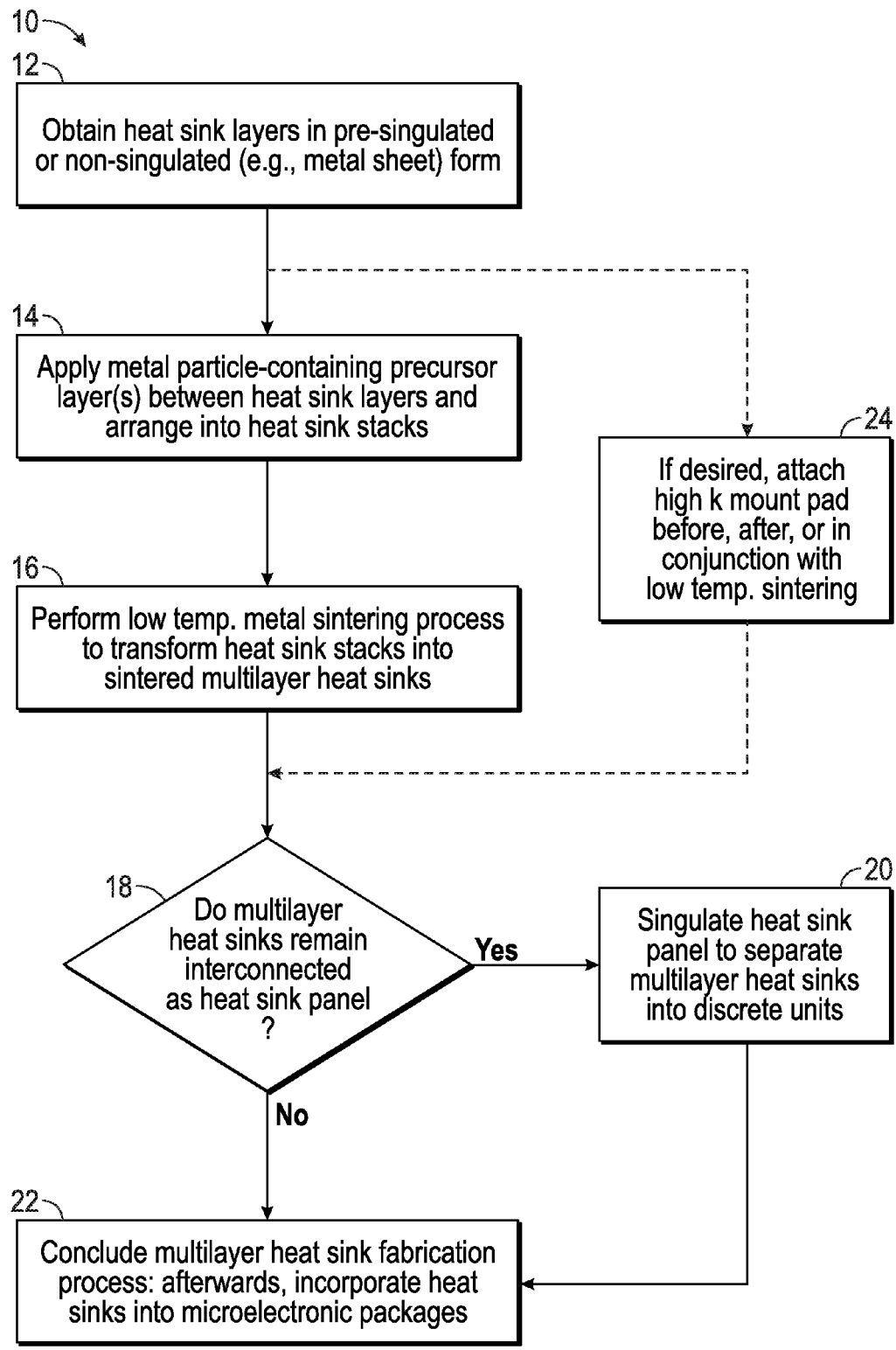
FIG. 1 is a flowchart setting-forth a method for fabricating multilayer heat sinks utilizing a low temperature metal sintering process, as illustrated in accordance with an exemplary embodiment of the present disclosure.

For simplicity and clarity of illustration, descriptions and details of well-known features and techniques may be omitted to avoid unnecessarily obscuring the exemplary and non-limiting embodiments of the invention described in the subsequent Detailed Description. It should further be understood that features or elements appearing in the accompanying figures are not necessarily drawn to scale unless otherwise stated. For example, the dimensions of certain elements or regions in the figures may be exaggerated relative to other elements or regions to improve understanding of embodiments of the invention.

DETAILED DESCRIPTION

The following Detailed Description is merely exemplary in nature and is not intended to limit the invention or the application and uses of the invention. The term "exemplary," as appearing throughout this document, is synonymous with the term "example" and is utilized repeatedly below to emphasize that the following description provides only multiple non-limiting examples of the invention and should not be construed to restrict the scope of the invention, as set-out in the Claims, in any respect.

As briefly described in the foregoing section entitled "BACKGROUND," multilayer heat sinks are commonly produced by bonding multiple metallic layers in a stacked or laminated configuration. For manufacturing efficiency, a number of multilayer heat sinks may be fabricated in parallel, while the respective metallic layers of the heat sinks are interconnected as a multilayer structure referred to herein as a "heat sink panel." During manufacture, a number of relatively large metal sheets are stacked and bonded to produce the heat sink panel. The metal sheets are "relatively large" as considered from a top-down or planform perspective and, when bonded, produce an equally large heat sink panel containing an array of integrally-connected multilayer heat sinks. The heat sink panel is then singulated (e.g., by stamping) to separate the multilayer heat sinks into discrete units, which are subsequently incorporated into microelectronic packages. Such a manufacturing process thus provides a relatively efficient means for fabricating a relatively large number of multilayer heat sinks, with each heat sink containing multiple metallic layers formed by the singulated pieces of the metal sheets initially contained within the heat sink panel.

Different techniques can be utilized to bond the stacked metal sheets in a heat sink panel during the above-described multilayer heat sink manufacturing process. Techniques favored for this purpose include metal brazing and rolling processes. However, while capable of forming relatively robust metallurgical bonds between stacked metal sheets, both of these techniques remained limited in certain respects. Consider first metal rolling. Metal rolling typically involves some form of hot rolling carried-out under relatively high pressures and highly elevated temperatures, which may approach or exceed 700 degrees Celsius (° C.). Such high temperatures and pressures tend to physically distort or warp the resulting heat sink panel, particularly near the peripheral edge regions thereof. The warped portions of the heat sink panel may be removed by trimming, but this is a suboptimal solution that increases scrap levels, raises production costs, and lowers yield. While additional processing, such as lapping, can be performed to help correct heat sink warpage, such additional processing also adds undesired cost and delay to the manufacturing process. The metal rolling process may also involve cold rolling in combination with hot rolling. While it may be theoretically possible to bond the metal sheets utilizing cold rolling in combination with annealing, such an approach would still require exposure of the heat sink panel to highly elevated processing temperatures.

In contrast to hot and cold rolling, metal brazing relies upon the melting and resolidification of a metal braze material to join the stacked metal sheets in a heat sink panel. However, as does hot rolling, metal brazing typically requires exposure to highly elevated process temperatures surpassing the melt point of the metal braze material, which commonly approaches or exceeds 800° C. Once again, such high temperature processing may result in undesired warpage of the heat sink panel and, therefore, physical distortion of the multilayer heat sinks contained therein. As a further drawback linked to metal brazing, uncontrolled or excessive voiding may occur within the liquefied braze material during heating and subsequent cooling, which can reduce the mechanical strength properties of the braze joints and diminish the overall thermal performance of the resulting multilayer heat sinks. There thus exists an ongoing demand for methods by which multilayer heat sinks can be fabricated with improved process efficiency, lower production costs, and greater reliability as compared to conventional multilayer heat sink fabrication processes.

The following describes methods for fabricating multilayer heat sinks utilizing low temperature metal sintering processes. During the low temperature sintering process, elevated temperatures, convergent pressures, or a combination of elevated temperatures and convergent pressures are utilized to induce sintering of metal particles distributed between the metal layers of a heat sink. The metal particles may be contained within precursor layers distributed between the metal heat sink layers as, for example, a paste or film. In certain embodiments, the multilayer heat sinks may be processed as freestanding units such that each heat sink is pre-singulated; that is, not interconnected with other heat sinks during the fabrication process. Alternatively, the multilayer heat sinks can be processed in parallel while interconnected as a heat sink panel, which is later singulated to separate the heat sinks into individual units. In either case, the low temperature sintering process can be performed at maximum process temperatures considerably lower than the maximum process temperatures associated with hot rolling, metal brazing, and similar high temperature bonding processes. Generally, the maximum process temperatures encountered during low temperature sintering may be less than the melt point of the metal particles subject to sintering. For example, in certain embodiments, the absolute temperature of sintering may be less than half the absolute melt point of the metal particles and, perhaps, less than about 300° C. By controlling the parameters of such a low temperature sintering approach, the metal particle-containing precursor layers can be transformed into sintered bond layers having desired thicknesses and little to no voiding (although the bond layers may have some degree of porosity). Additionally, by controlling sintering parameters and by tailoring the formulation of the precursor material from which the sintered layers are produced, the sintered bond layers can be produced to contain organic materials, such as a strength-enhancing epoxy, or consist essentially of a highly conductive metal (e.g., silver, gold, or copper) lacking non-trace amounts of organic materials. The end result is highly efficient multilayer heat sink fabrication process, which overcomes or at least mitigates thermally-inducted warpage, excessive scrap levels, low product yields, excessive bond layer voiding, and other such issues associated with conventional heat sink fabrication processes of the type described above.

In addition to or in lieu of bonding the heat sink layers utilizing a low temperature sintering process, the heat sink fabrication method may also involve the attaching of at least one high thermal conductivity ("high κ") mount pad to the layered heat sink body. When included within a multilayer heat sink, the high κ mount pad serves as a thermally-conductive substrate or support structure to which one or more microelectronic devices (e.g., semiconductor die) are subsequently attached. In an embodiment of the heat sink fabrication method, the high κ mount pad may be attached to the upper principal surface of the uppermost metal layer utilizing a thermally-conductive bonding material, such as a sintered bond layer. When a sintered bond layer is utilized to attach the high κ mount pad, the sintered bond layer may be similar or identical in composition to the sintered bond layers utilized to interbond the metal layers of the heat sink and/or a common sintering process may be utilized to sinter the mount pad-attaching bond layer in concert with the bond layers joining the metal heat sink layers. In certain implementations, the high κ mount pad may be embedded within the body of the multilayer heat sink and, perhaps, mounted within an open cavity provided in the uppermost metal layer such that the upper principal surface of the mount pad is substantially flush or coplanar with the upper principal surface of the uppermost metal layer. In either case, the provision of such a high κ mount pad may further enhance the heat dissipation capabilities of the multilayer heat sink. By way of non-limiting illustration, exemplary embodiments of such a multilayer heat sink fabrication process will now be described in conjunction with FIGS. 1-10.

FIG. 1 is a flowchart setting-forth a method 10 for fabricating multilayer heat sinks utilizing a low temperature metal sintering process, as illustrated in accordance with an exemplary embodiment of the present disclosure. Heat sink fabrication method 10 includes a number of process STEPS 12, 14, 16, 18, 20, 22, and 24, each of which is described in detail below. Depending upon the particular manner in which heat sink fabrication method 10 is implemented, each step generically illustrated in FIG. 1 may entail a single process or multiple sub-processes. Furthermore, the steps illustrated in FIG. 1 and described below are provided by way of non-limiting example only. In alternative embodiments of heat sink fabrication method 10, additional process steps may be performed, certain steps may be omitted, and/or the illustrated process steps may be performed in alternative sequences.

Heat sink fabrication method 10 commences at STEP 12 (FIG. 1) during which a number of metal layers are obtained by, for example, purchase from a supplier. As appearing herein, the term "metal layer" refers to a body of material or relatively thin structure predominately composed of one or more metals. In certain instances, a given metal layer may be wholly composed of an essentially pure metal (that is, a metal having a purity exceeding 99.9% by weight), such as essentially pure copper (Cu), molybdenum (Mo), silver (Ag), gold (Au), aluminum (Al), or nickel (Ni), to list but a few examples. In other instances, a particular "metal layer" may be composed of an alloy or composite material containing one or more metals (e.g., Cu and/or Mo) as its primary constituents, possibly in addition to lesser amounts of other metallic or non-metallic constituents. By extension, reference to a named metal layer is utilized herein to indicate that the named metal is the primary constituent contained with the metal layer, considered by weight percentage (% wt). Thus, as an example, the term "Cu layer" refers to a metal layer composed predominately of Cu, by weight, whether the metal layer is produced from essentially pure Cu, a Cu-based alloy, or a Cu-based composite. Similarly, reference to a named metal layer by two or more named metals indicates that the named metals are primary constituents within the metal layer. For example, identification of a metal layer as a "Cu—Mo metal layer" indicates that the Cu and Mo are the primary constituents within the metal layer, which may contain a greater amount of Cu, a greater amount of Mo, or equal amounts Cu and Mo.

The number and composition of metal layers obtained during STEP 12 will vary amongst embodiments of heat sink fabrication method 10 (FIG. 1). Generally, two or more metal layers will be acquired during STEP 12, with at least two metal layers having disparate compositions. In certain implementations, at least one Cu layer will be acquired, along with at least one metal layer having a Coefficient of Thermal Expansion (CTE) less than the CTE of the Cu layer. In many cases, a given multilayer heat sink will be produced to contain three to five metal layers, although a given multilayer heat sink may have as few as two layers or more than five layers, as well. Further description of useful metal layer compositions and combinations is provided below in conjunction with FIG. 2. Furthermore, as indicated briefly above, the metal layers can be acquired and processed in a fully singulated, partially singulated, or non-singulated form. Generally, process efficiency is increased by obtaining and processing the metal layers in a non-singulated "sheet" form such that a number of multilayer heat sinks are produced in parallel as a heat sink panel, which is later singulated to separate the heat sinks into individual units. For this reason, the following describes heat sink fabrication method 10 (FIG. 1) primarily in this context. This notwithstanding, it will be appreciated that the below-described process steps can alternatively be performed utilizing metal layers obtained in a precut or pre-singulated form such that additional singulation is not required following the below-described sintering process.

Figure 2:
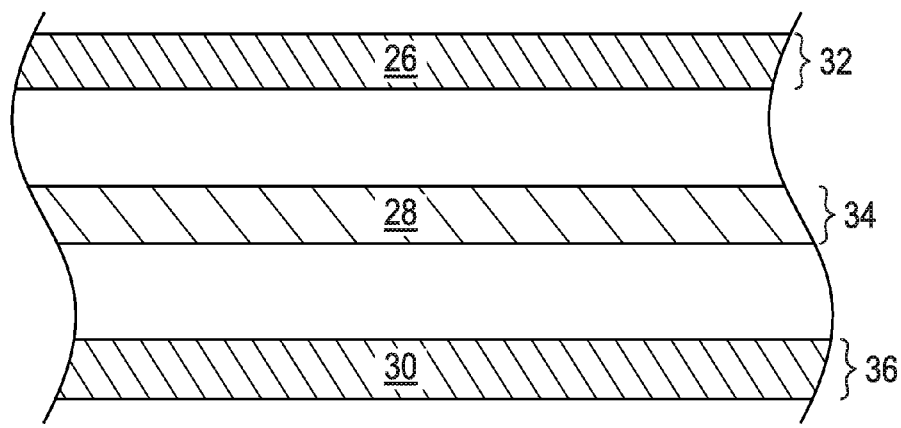
FIGS. 2-6 are simplified cross-sectional views of a first exemplary multilayer heat sink, as shown at various stages of completion and produced in accordance with the fabrication method of FIG. 1.

FIG. 2 is a cross-sectional view of three metal layers 26, 28, 30, which may be obtained during STEP 12 in an exemplary implementation of heat sink fabrication method 10 (FIG. 1). In this particular example, metal layers 26, 28, 30 are obtained and processed in sheet form. Metal layers 26, 28, 30 are thus acquired as integral parts of larger metal sheets 32, 34, 36, respectively. For illustrative clarity, only a relatively small region of each metal sheet 32, 34, 36 is shown in FIG. 2 and, specifically, the regions of metal sheet 32, 34, 36 containing and extending slightly beyond metal layers 26, 28, 30. Metal sheets 32, 34, 36 will typically be considerably larger than the illustrated regions of sheets 32, 34, 36 such that the non-illustrated sheet regions can be processed, as described below, to produce a number of additional multilayer heat sinks in parallel with the heat sink produced from metal layers 26, 28, 30. Metal layer 26 and metal sheet 32 will be referred to hereafter as an upper metal layer and an upper metal sheet, respectively; metal layer 28 and metal sheet 34 will be referred to as an intermediate metal layer and an intermediate metal sheet, respectively; and metal layer 30 and metal sheet 36 will be referred to as a lower metal layer and a lower metal sheet, respectively. Such terminology is utilized with reference to the accompanying drawings and should not be considered limiting in any respect.

The dimensions and planform shapes of metal sheets 32, 34, 36 will vary amongst embodiments and may be selected based, at least in part, on the number of multilayer heat sinks desirably manufactured during each iteration of fabrication method 10 (FIG. 1). Metal sheets 32, 34, 36 will often (but need not necessarily) have a generally rectangular form factor when viewed from a top-down or planform perspective, such as a strip-like or square form factor. In this case, metal sheet 32, 34, 36 may each contain a relatively large number of metal layers distributed along a plane of the metal sheet as a grid containing multiple columns and at least one row. Other metal sheet geometries are also possible, providing that each metal sheet contains at least two metal layers integrally joined in a side-by-side or edge-coupled relationship and distributed along a plane of the metal sheet. Additionally, metal sheets 32, 34, 36 need not be continuous metal planes in all embodiments. Instead, in certain embodiments, one or more of metal sheets 32, 34, 36 may have cut-outs or openings, which are filled with a sintered material during the below-described sintering process. Furthermore, metal sheets 32, 34, 36 need not be homogenous in all embodiments, but may instead contain regions of varying composition or embedded features, such as metal coining. The foregoing statements are equally applicable to metal layers 26, 28, 30 contained within metal sheets 32, 34, 36.

The respective compositions of metal layers 26, 28, 30 (and, more generally, of metal sheets 32, 34, 36) will vary amongst embodiments, providing that at least two of metal layers 26, 28, 30 are composed of disparate metallic materials. In many, but not necessarily all cases, upper metal layer 26 (and upper metal sheet 32) will be composed of a material having a thermal conductivity greater than and a CTE greater than at least one of metal layers 28, 30. For example, in certain embodiments, upper metal layer 26 may be composed of essentially pure Cu or, alternatively, a Cu-based alloy or composite having a higher Cu content than the Cu content of at least one of metal layers 26, 28. In one embodiment, upper metal layer 26 and lower metal layer 30 (and, thus, metal sheets 32, 36) are each composed of a Cu-based alloy or composite having a first Cu content, while intermediate metal layer 28 (and metal sheet 34) is composed of a disparate alloy or composite lacking Cu or otherwise containing a lesser amount of Cu by weight. In this case, intermediate metal layer 28 may be composed of essentially pure Mo or a Mo-based material, such as a CuMo-based composite or alloy having a Cu content less than that of metal layers 26, 30. Accordingly, the thermal conductivity of intermediate metal layer 28 may be slightly less than that of metal layers 26, 30 (although still objectively high), while the CTE of metal layer 28 is less than that of metal layers 26, 30 to reduce the effective CTE of the multilayer heat sink produced from layers 26, 28, 30. Finally, metal layers 26, 28, 30 may each have a thickness between about 0.05 and 0.75 millimeter (mm) in an embodiment. In other embodiments, metal layers 26, 28, 30 may be thicker or thinner than the aforementioned range. Additionally, while generically depicted as having substantially equivalent thicknesses in the illustrated example, metal layers 26, 28, 30 may have varied thicknesses in further embodiments.

The principal surfaces of metal layers 26, 28, 30 (and, thus, the principal surfaces of metal sheets 32, 34, 36) obtained during STEP 12 of fabrication method 10 (FIG. 1) may be plated, coated, or left bare. In one embodiment, metal layers 26, 28, 30 include at least one principal surface over which a metal plating is produced and which is subsequently contacted with the below-described metal particle-containing precursor layers. When present, the metal plating can be composed of Ag, Au, a nickel-palladium-gold (Ni—Pd—Au) alloy, or another metal or alloy. In other embodiments, at least one of the principal surfaces of metal layers 26, 28, 30 may be covered by an organic coating, such as an organic surface protection (OSP) coating. In this case, the organic coating may decompose during the below-described low temperature sintering process and, thus, may not be present in the completed multilayer heat sinks. As a still further possibility, all or a subset of the principal surfaces of metal layers 26, 28, 30 (and, therefore, the principal surfaces of metal sheets 32, 34, 36) may be left bare. Generally, then, the metal layers acquired during STEP 12 of fabrication method 10 (FIG. 1) can have various different combinations of coatings, plantings, bare surfaces, and coating systems. Further, if desired, one or more principals surfaces of metal layers 26, 28, 30 (and, therefore, metal sheets 32, 34, 36) may be roughened, shallowly scribed, or otherwise treated to increase the surface area available for bonding during the low temperature sintering process described below in conjunction with STEP 16 of fabrication method 10 (FIG. 1).

Next, heat sink fabrication method 10 (FIG. 1) advances to STEP 14 during which one or more metal particle-containing precursor layers are formed on selected surfaces of the metal heat sink layers. The metal particle-containing precursor layers are formed on the metal heat sink layers during or prior to arranging the metal layers in a stacked relationship. In many embodiments, at least one metal particle-containing precursor layer is formed between each neighboring or vertically-adjacent pair of metal sheets within the stacked arrangement; the term "vertical," as appearing herein, corresponding to an axis orthogonal to the principal surfaces of metal layers 26, 28, 30. The metal particle-containing precursor layers may be formed by application of a freestanding film, by deposition utilizing a wet-state dispensing process, or in any other manner permitting controlled application of the precursor layer material to one or more selected surfaces of metal layers 26, 28, 30 and, more generally, metal sheets 32, 34, 36. The particular formulation or composition of the metal particle-containing precursor layers may vary amongst embodiments, providing each precursor layer contains metal particles amenable to sintering (densification without liquefaction) during the below-described sintering process. Additional discussion of possible formulations of the metal particle-containing precursor layers is provided below.

Figure 3:
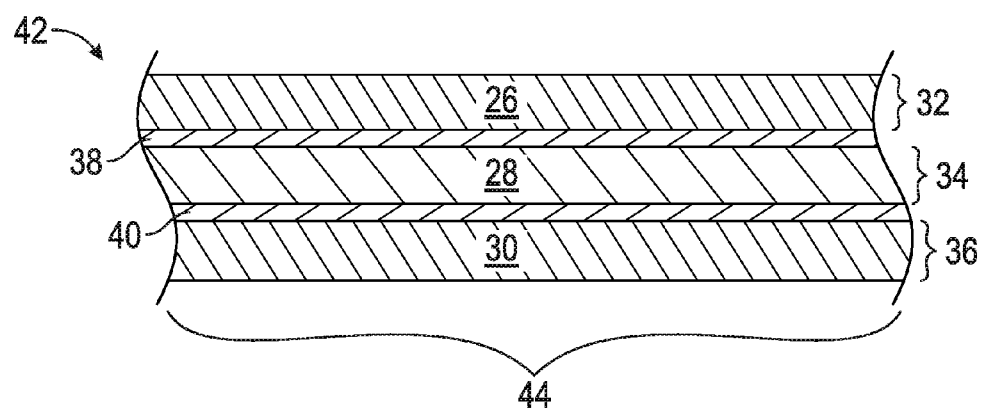

FIG. 3 illustrates metal layers 26, 28, 30 after arrangement of metal layers 26, 28, 30 (and, more generally, metal sheets 32, 34, 36) in a stacked or vertically overlapping relationship. As can be seen, two metal particle-containing precursor layers 38, 40 have been formed between metal layers 26, 28, 30. Specifically, a first metal particle-containing precursor layer 38 has been formed between metal layers 26, 28, while a second metal particle-containing precursor layer 40 has been formed between metal layers 28, 30. Metal particle-containing precursor layer 38 also extends between metal sheets 32, 34, although precursor layer 38 may not extend fully to the outer perimeter of sheets 32, 34 and may only be applied to the regions of sheets 32, 34 ultimately included in a multilayer heat sink. This is also true of metal particle-containing precursor layer 40, which extends between metal sheets 34, 36. Collectively, metal sheets 32, 34, 36 and metal particle containing precursor layers 38, 40 form a pre-sintered heat sink panel, which is identified in FIG. 3 by reference numeral "42." The portion of pre-sintered heat sink panel 42 encompassing metal layers 26, 28, and 30 is further identified by reference number "44" and is referred to hereafter as "pre-sintered multilayer heat sink 44."

Metal particle-containing precursor layers 38, 40 can be applied between metal layers 26, 28, 30 (and, more generally, metal sheets 32, 34, 36) utilizing a wet state application technique, a dry state application technique, or in another manner. Suitable wet state application techniques include, but are not limited to, screen or stencil printing, doctor blading, spraying, painting, and dipping. When a wet state application technique is employed, a flowable or wet state coating precursor material is initially obtained by, for example, independent production or purchase from a third party supplier. In addition to metal particles (described below), the wet state coating precursor material contains other ingredients (e.g., a solvent and/or surfactant) to facilitate wet set application, to adjust the viscosity of the precursor material, to prevent premature agglomeration of the metal particles, and/or to serve other purposes. In one embodiment, the wet state coating precursor material contains metal particles in combination with a binder (e.g., an epoxy), a dispersant, and a thinner or liquid carrier. The volume of solvent or liquid carrier contained within the coating precursor material can be adjusted to tailor of the viscosity of the precursor material to the selected wet state application technique. For example, in embodiments wherein the precursor material is applied by screen printing or doctor blading, the coating precursor material may contain sufficient liquid to create a paste, slurry, or paint. After application of the wet state coating material, a drying process can be carried-out to remove excess liquid from the metal particle-containing precursor layers material, if so desired. Metal layers 26, 28, 30 (and, therefore, metal sheets 32, 34, 36) may then be arranged in the stacked relationship shown in FIG. 3. When applied as paste layers or other wet-state layers, metal particle-containing precursor layers 38, 40 can potentially be sequential sintered in separate steps, but are preferably sintered collectively or concurrently after panel stack-up utilizing a common sintering process.

In further embodiments, metal particle-containing precursor layers 38, 40 can be applied to selected surfaces of metal layers 26, 28, 30 (and, therefore, metal sheets 32, 34, 36) utilizing a dry state application technique. For example, a film transfer process can be employed to apply metal particle-containing precursor layers 38, 40 to the appropriate surfaces of metal layers 26, 28, 30. In this case, a dry film may first be prepared by, for example, initially depositing (e.g., screen printing or otherwise dispensing) one or more metal particle-containing precursor layers onto a temporary substrate or carrier, such as a plastic (e.g., polyethylene terephthalate (PET) or other material) tape backing. The metal particle-containing precursor layers may be applied in a wet, flowable state to the carrier and then heated or otherwise dried to yield the dry film. Next, the dry film is transferred to the appropriate surfaces of metal layers 26, 28, 30 (and metal sheets 32, 34, 36). In this regard, a given metal particle-containing precursor layer is positioned in contact with a chosen metal layer or sheet. Heat, pressure, or both heat and pressure are then applied to adhere the metal particle-containing precursor layer (dry film) to the selected metal layer or sheet surface. The carrier (e.g., tape backing) may then be removed by physical removal (e.g., peeling away) or by dissolution in a chemical solvent. This process may then be repeated to apply additional particle-containing precursor layers to other selected surfaces of metal layers 26, 28, 30 (and metal sheets 32, 34, 36). In other embodiments, one or more freestanding films may simply be positioned between metal layers 26, 28, 30 during the stacking process (also considered "film transfer" in the present context). In this case, the various film layers and metal layers can be bonded in a single step, if so desired.

The metal particles contained within precursor layers 38, 40 can have any composition, shape, and size enabling the particles to form a substantially coherent adhesive layer pursuant to the below-described sintering process. In one embodiment, metal particle-containing precursor layers 38, 40 contain Au, Ag, or Cu particles, or a mixture thereof. In another embodiment, the metal particles contained within precursor layers 38, 40 consist essentially of Ag or Cu particles. The metal particles contained within precursor layers 38, 40 may or may not be coated with an organic material. For example, in some implementations, the metal particles may be coated with an organic dispersant, which prevents physical contact between the particles to prevent premature agglomeration or particle sintering. When present, any such organic particle coating may be burned away or decomposed during the below-described metal sintering process.

The metal particles contained within precursor layers 38, 40 can have any shape or combination of shapes including, but not limited to, spherical shapes, oblong shapes, and platelet or laminae shapes. The average dimensions of the metal particles will vary in conjunction with particle shape and process parameters. However, in general, the average maximum dimension of the metal particles (e.g., the diameter of the metal particles when spherical or the major axis of the metal particles when oblong) may be between about 100 microns (μm) and about 10 nanometers (nm) in an embodiment. In other embodiments, the metal particles may have average maximum dimension greater than or less than the aforementioned range. In certain implementations, a mixture of metal particles having average maximum dimensions in both the nanometer and micron range may be utilized. In other implementations, only nanoparticles (that is, particles having average maximum dimension between 1 and 1000 nm) may be contained within metal particle-containing precursor layers 38, 40. As a specific, albeit non-limiting example, precursor layers 38, 40 may contain at least one of Ag, Au, or Cu nanoparticles in an embodiment, with Ag or Cu nanoparticles being preferred.

Advancing to STEP 16 of heat sink fabrication method 10 (FIG. 1), a low temperature sintering process is performed to produce sintered bond layers from metal particle-containing precursor layers 38, 40. The low temperature sintering process can be carried-out under any process conditions suitable for transforming metal particle-containing precursor layers 38, 40 into sintered bond layers (STEP 16, FIG. 1) and noting that some diffusion may occur from precursor layers 38, 40 into metal layers 26, 28, 30 (and, therefore, into metal sheets 32, 34, 36). The sintering process may be performed with or without pressure, with or without heating (although some degree of elevated heat will typically be applied), and in any suitable atmosphere (e.g., open air or in the presence of an inert gas, such as nitrogen). As a point of emphasis, however, the sintering process is carried-out at maximum process temperatures ($T_{MAX}$) less than the melt point of the metal particles contained within precursor layers 38, 40. Indeed, in many embodiments, $T_{MAX}$ will be significantly less than the melt point of the metal particles and, perhaps, less than one half the melt point of the particles considered on an absolute temperature scale (in Kelvin). Generally, $T_{MAX}$ will be greater than room temperature (considered 20° C. herein) and less than 300° C. Comparatively, the melt point of Ag, Au, and Cu particles in a nanometer or micron size range will commonly range between 950° C. to 1100° C. To provide a still further example, $T_{MAX}$ may be between 170° C. and 300° C. in an embodiment. In still further embodiments, $T_{MAX}$ may be greater than or less than the aforementioned range, providing that $T_{MAX}$ (in conjunction with the other process parameters) is sufficient to induce sintering of the metal particles without liquefaction of the metal particles.

In many implementations, a multistage heating schedule will be employed during the sintering process. In this case, the multistage heating schedule may entail heating the pre-sintered multilayer heat sink (and the pre-sintered heat sink panel, if the heat sink is processed in panel form) to a first temperature ($T_1$) less than $T_{MAX}$ for a first time period, gradually ramping the temperature to $T_{MAX}$, maintaining $T_{MAX}$ for a second time period, and concluding with a cool down period. In one embodiment, and by way of non-limiting example only, $T_1$ may be between 100 and 200° C., while $T_{MAX}$ is greater than $T_1$ and ranges between 170 and 280° C. As discussed below, the process parameters employed may or may not be selected to fully decompose any organic material from precursor layers 38, 40 during sintering.

As noted above, the low temperature sintering process carried-out during STEP 16 (FIG. 1) may be pressureless. Alternatively, a convergent pressure or compressive force may be applied across the pre-sintered multilayer heat sink (and the pre-sintered heat sink panel, if the heat sink is processed in panel form) during the sintering process. When applied, the convergent pressure can be delivered as a substantially constant force or, instead, varied in accordance with a time-based or temperature-based schedule. Any suitable mechanism can be utilized to apply the desired convergent pressure including bulk weights, resilient bias devices (e.g., spring-loaded plungers or pins), clamps, hydraulic presses, and the like. The pressure applied may be selected based upon various factors including the desired final thickness of the sintered bond layers, the desired porosity of the sintered bond layers, and the composition of the metal particle-containing precursor layers. In one embodiment, and by way of non-limiting example only, a maximum pressure ($P_{MAX}$) ranging between about 0.5 and about 20 megapascal (Mpa) is applied during the sintering process. In other embodiments, $P_{MAX}$ may be greater than or less than the aforementioned range, if pressure is applied during the sintering process.

Figure 4:
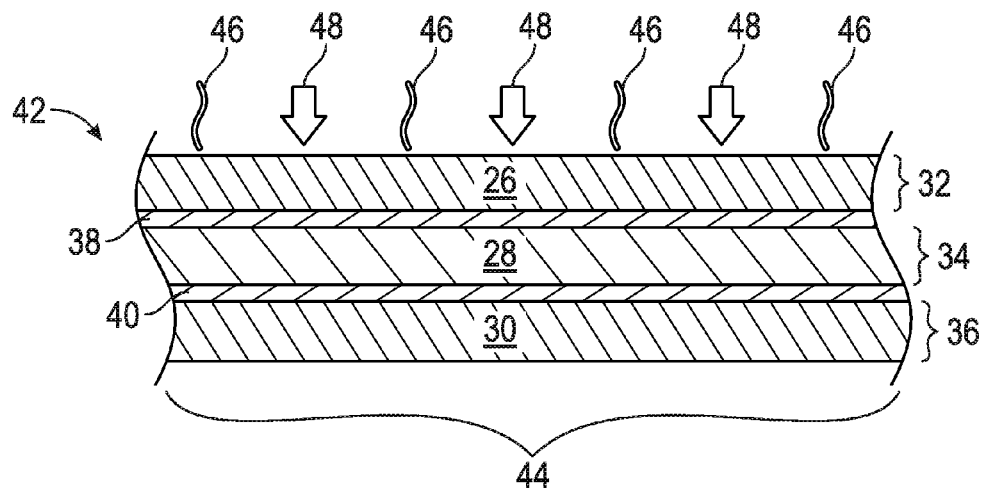
Figure 5:
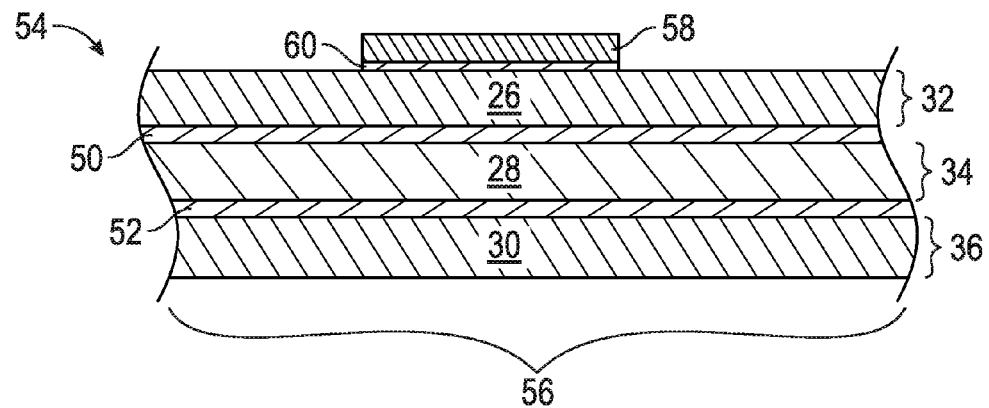

FIG. 4 illustrates pre-sintered heat sink panel 42 and, specifically, pre-sintered multilayer heat sink 44 during low temperature sintering. In this particular example, both heat (represented by heat lines 46) and convergent pressure (represented by arrows 48) are applied to pre-sintered heat sink panel 42 to transform metal particle-containing precursor layers 38, 40 into sintered bond layers. The resulting structure is shown in FIG. 5 in which the sintered bond layer produced from precursor layer 38 is identified by reference numeral "50," while the sintered bond layer produced from precursor layer 40 is identified by reference numeral "52." Additionally, the newly-sintered heat sink panel is identified by reference numeral "54" in FIG. 5, while the sintered (but not yet singulated) multilayer heat sink is identified by reference numeral "56." Metal layers 26, 28, 30 of multilayer heat sink 56 are now metallurgically inter-bonded by sintered bond layers 50, 52.

Sintered bond layers 50, 52 are composed predominately of one or more sintered metals and may or may not contain organic materials. In one embodiment, sintered bond layers 50, 52 consist essentially of one or more metals (e.g., essentially pure Cu or essentially pure Ag) and are essentially free of organic material (that is, contain less than 1 wt % of organic materials). In other embodiments, sintered bond layers 50, 52 may contain resin or other organic fillers. For example, in another implementation, sintered bond layers 50, 52 may contain organic materials that increase pliability, such as an epoxy, to reduce the likelihood of crack formation and propagation across thermal cycles of sintered multilayer heat sink 56. Depending upon the desired final composition of sintered bond layers 50, 52, the parameters of the sintering process may be controlled to decompose organic materials from the metal particle-containing precursor layers, in whole or in part. Additionally, sintered bond layers 50, 52 may be produced to have a desired porosity, which may range from 0% to 30% by volume in an embodiment. In another embodiment, sintered bond layers 50, 52 may be formed to each have a porosity of less than 1% by volume. Finally, the thickness of sintered bond layers 50, 52 will vary amongst embodiments, but may range between about 5 and about 100 µm and, preferably, between about 15 and about 35 µm in one exemplary and non-limiting embodiment. In one embodiment wherein sintered bond layers 50, 52 are composed of essentially pure Ag or Cu, bond layers 50, 52 may have a thickness range from about 40 to about 100 µm.

Turning to STEPS 18 and 20 of multilayer heat sink fabrication method 10 (FIG. 1), singulation of the multilayer heat sinks is next performed, if needed. Thus, in the case of sintered heat sink panel 54 (FIG. 5), singulation may be performed to separate sintered multilayer heat sink 56 and the other non-illustrated heat sinks contained within heat sink panel 54 into discrete units. Singulation can be carried-out by sawing (e.g., utilizing a water-cooled dicing saw), laser cutting, water jetting, stamping, or scribing with punching, to list but a few examples. Sintered multilayer heat sink 56 is shown after singulation in FIG. 6, as may be appreciated by referring to substantially vertical sidewalls 62 defined by singulation of sintered heat sink panel 54 (FIG. 5). As indicated in FIG. 1, multilayer heat sink fabrication method 10 may conclude after singulation of sintered heat sink panel 54 (STEP 22). In alternative embodiments, further processing steps may be performed after panel singulation, such as attachment of one or more high κ mount pads to the multilayer heat sink body, as described below. Now complete, sintered multilayer heat sink 56 and the other non-illustrated multilayer heat sinks produced pursuant to fabrication method 10 (FIG. 1) can be incorporated into microelectronic packages, although the incorporation of the heat sinks into microelectronic packages may be carried-out by a different entity at a later juncture in time. For completeness, an exemplary embodiment of a microelectronic package into which sintered multilayer heat sink 56 may be incorporated is described below in conjunction with FIG. 7.

In certain embodiments of multilayer heat sink fabrication method 10 (FIG. 1), a high κ mount pad may be attached to the layered body of the multilayer heat sink. This is indicated in FIG. 1 at STEP 24, with dashed lines denoting that such a step need not be performed in all implementations of fabrication method 10. When provided, the high κ mount pad can be attached to a selected metal layer prior to, during, or after the low temperature sintering process carried-out during STEP 16 of fabrication method 10 (FIG. 1). In certain embodiments, the high κ mount pad may be bonded to the uppermost metal layer of the multilayer heat sink by sintering a metal particle-containing precursor layer in a manner similar to or substantially identical to that described above. In this case, a common sintering process can be performed to sinter-bond the metal heat sink layers, while simultaneously attaching the high κ mount pad to the body of the heat sink for process efficiency. Additional description of the inclusion of such a high κ mount pad in the multilayer heat sink will now be provided in conjunction with FIGS. 5 and 6.

Referring again to FIGS. 5 and 6, it can be seen that a high κ mount pad 58 has been attached to the upper principal surface of upper metal layer 26 by a mount pad bond layer 60. High κ mount pad 58 is composed of a material having a thermal conductivity exceeding than that of essentially pure copper (e.g., 386 Watts per meter Kelvin (W/m·K)), but which is not desirably utilized to produce a full heat sink layer due to excessive cost. A non-exhaustive list of suitable mount pad materials includes gold alloys, diamond polycarbonate materials, composite materials (e.g., diamond-metal composites, such as diamond Au, diamond Ag, and diamond Cu), pyrolytic graphite, and materials containing allotropes of carbon, such as graphene and carbon nanotube-filled materials. If desired, such materials can be chosen to have asymmetric thermal conductivity properties. Additionally, the surfaces of high κ mount pad 58 may be left bare, plated, or coated; e.g., in one embodiment, high κ mount pad 58 may be composed of a diamond Ag composite having an Ag shell. High κ mount pad 58 has planform dimensions less than upper heat sink layer 26, while further having a thermal conductivity exceeding that of layer 26. Although not shown, it will be appreciated that additional non-illustrated high κ mount pads may also be distributed in an array across the non-illustrated portions of heat sink panel 54 (FIG. 5) and included within other multilayer heat sinks produced therefrom. In this case, the array of mount pads can be provided in a leadframe format or, instead, individually positioned across the upper surface of heat sink panel 54 (FIG. 5) utilizing, for example, a pick-and-place tool.

Figure 6:
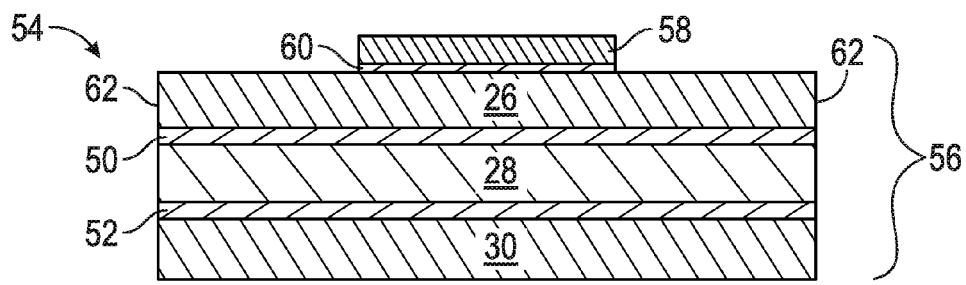
Figure 7:
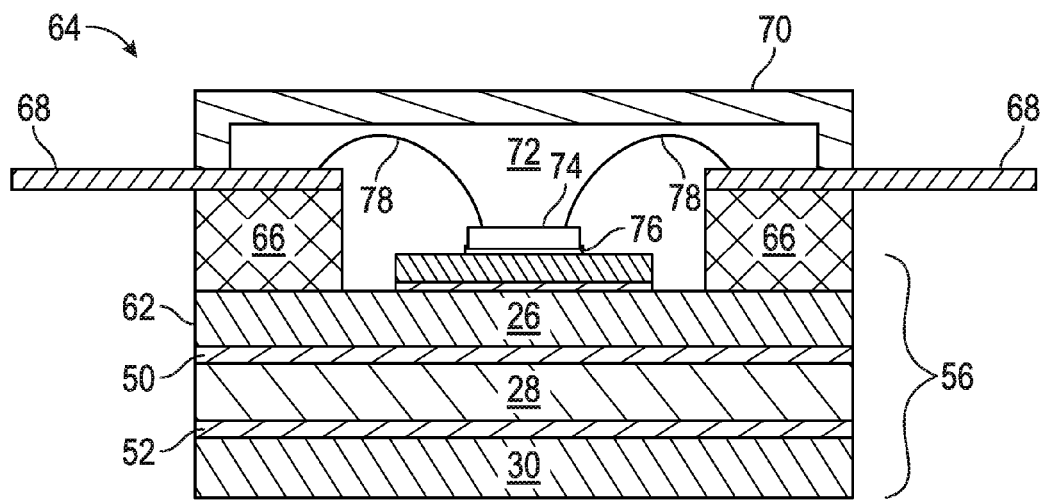
FIG. 7 is a simplified cross-sectional view of the multilayer heat sink shown in FIG. 5, as shown after incorporation into an exemplary leaded microelectronic package.

In the illustrated embodiment shown in FIGS. 6 and 7, high κ mount pad 58 has a rectangular planform shape and is generally centered with respect to the multilayered body of sintered heat sink 56 (FIG. 6). In further embodiments, high κ mount pad 58 may be attached to the body of sintered heat sink 58 at another location, the dimensions and geometry of high κ mount pad 58 may vary, and/or multiple high κ mount pads may be integrated into sintered heat sink 58. Mount pad bond layer 60 may be composed of any thermally-conductive material suitable for attaching high κ mount pad 58 to heat sink layer 26. Suitable materials include thermally-conductive epoxies and die attach materials. Alternatively, mount pad bond layer 60 (and possibly sintered bond layers 50, 52) may be composed predominately or consist essentially of a sintered metal, such as Au, Cu, or Ag. In such embodiments, mount pad bond layer 60 may have a composition similar or substantially identical to that of sintered bond layers 50, 52 and may be produced utilizing the above-described deposition and sintering processes. Additionally, in this case, mount pad bond layer 60 may be produced utilizing a common sintering process, which is also preformed to sinter precursor layers 38 and 40 (FIGS. 3 and 4) and yield sintered bond layers (FIGS. 5 and 6). In this regard, a metal particle-containing precursor layer may be applied at the interface of mount pad 58 and metal layer 26 (and at interfaces between the other mount pads within the array and metal sheet 32), and then the metal particle-containing layers may be sintered to transform the metal particle-containing precursor layers into sintered bond layers (e.g., bond layer 60) bonding the mount pads to metal sheet 32.

FIG. 7 is a simplified cross-sectional view of an exemplary microelectronic package 64 into which sintered multilayer heat sink 56 may be incorporated, as illustrated with a further exemplary embodiment of the present disclosure.

In this particular example, microelectronic package 64 assumes the form of a leaded air cavity package and will thus be referred to hereafter as "air cavity package 64" hereafter. In addition to sintered multilayer heat sink 56, air cavity package 64 includes a ring-shaped structure or "window frame" 66. Window frame 66 extends around the centerline of package 64 to surround high κ mount pad 58. A number of leads 68 are disposed over the upper surface of window frame 66. Window frame 66 is produced from a ceramic or another dielectric material and electrically isolates leads 68 from sintered multilayer heat sink 56. A dielectric cover piece 70 is further bonded over window frame 66 and leads 68. Collectively, cover 70 and window frame 66 define an internal cavity 72 within air cavity package 64. Cavity 72 can be filled with a partial vacuum, air, or an inert gas. Cavity 72 is sealed from the ambient environment, although a strict hermetic seal may not be provided. At least one semiconductor die 74 is further installed within cavity 72 and attached to high κ mount pad 58 by a layer of die attach material 76. A number of wire bonds 78 provide electrical interconnection between die 74 and leads 68, which may serve as drain and gate contacts of air cavity package 64 in an embodiment. Additionally, sintered multilayer heat sink 56 is electrically conductive and may serve as a source contact or "source flange" of air cavity package 64. In further embodiments, sintered multilayer heat sink 56 may not serve as an electrically-conductive terminal and/or multilayer heat sink 56 may be incorporated into a different type of microelectronic package.

The foregoing has thus provided exemplary embodiments a method for fabricating multilayer heat sinks utilizing low temperature sintering processes. Advantageously, the above-described fabrication method enables the production of multilayer heat sinks in a highly reliable, cost effective manner, while yielding sintered bond layers having relatively high thermal conductivities and controlled thicknesses. Additionally, the sintered bond layers can be produced to consist essentially of relatively pure metal or, instead, may contain an epoxy or other organic materials. In the latter regard, the sintering process may be carried-out under process conditions at which a substantially portion (e.g., at least a volumetric majority) of the organic materials (e.g., epoxy) remains within the sintered bond layers. In certain embodiments, the sintered multilayer heat sinks can further be produced to include high κ mount pads, which are bonded to the layered body of the heat sink and to which semiconductor die or other microelectronic devices are subsequently attached. In further embodiments, multiple microelectronic devices may be attached to a given sintered multilayer heat sinks, with the devices attached to the uppermost heat sink layer, to high κ mount pads, or to a combination thereof. To help emphasize this point, a further exemplary embodiment of a multilayer heat sink produced in accordance with fabrication method 10 (FIG. 1) will now be described in conjunction with FIGS. 8-10.

Figure 8:
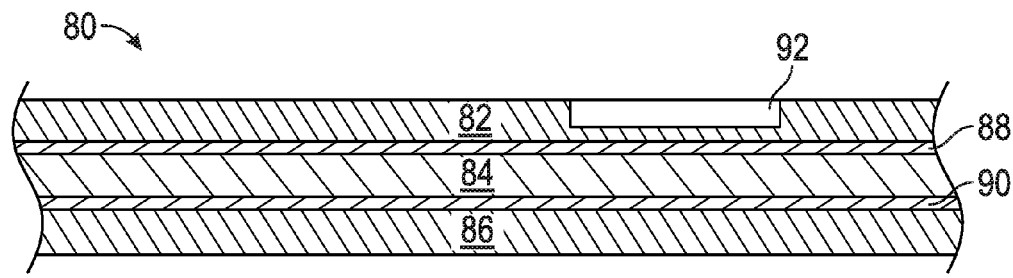
FIGS. 8-10 are cross-sectional views of a second exemplary multilayer heat sink shown before and after singulation, respectively, and further produced in accordance with the fabrication method of FIG. 1.
Figure 9:
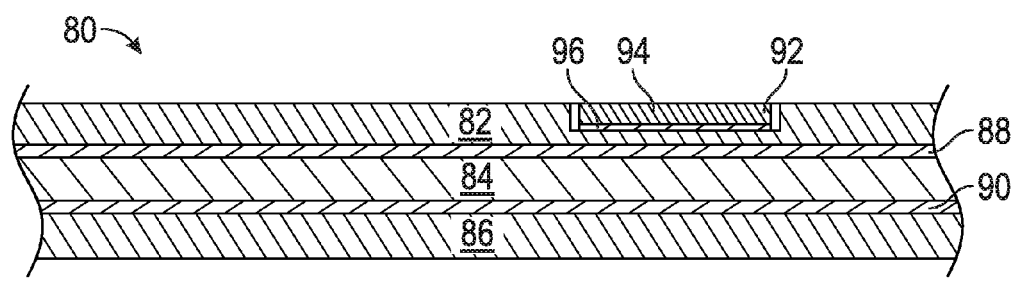
Figure 10:
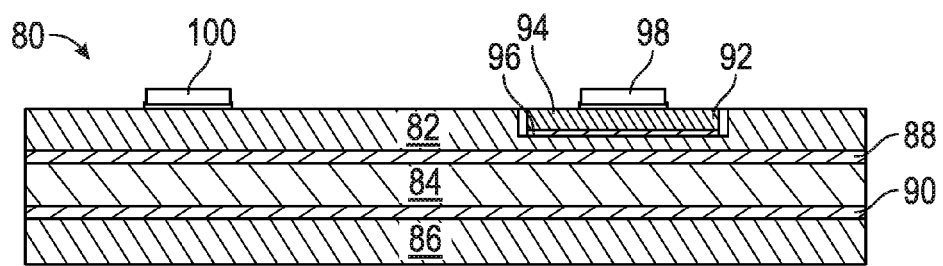

FIGS. 8-10 are cross-sectional views of sintered multilayer heat sink 80, as shown at various stages of completion and illustrated in accordance with a further exemplary embodiment of the present disclosure. In many respects, sintered multilayer heat sink 80 is similar to sintered multilayer heat sink 56 described above in conjunction with FIGS. 2-7. For example, multilayer heat sink 80 includes three metal layers 82, 84, 86, which are interspersed with and joined by two sintered bond layers 88, 90. Sintered bond layers 88, 90 may be produced in accordance with a low temperature sintering process of the type described above in conjunction with STEPS 14 and 16 of fabrication method 10 (FIG. 1). Once again, a high κ mount pad 94 has been attached to upper metal layer 82 utilizing a (e.g., sintered) bond layer 96. However, in this case, high κ mount pad 94 is not mounted to the upper principal surface of upper metal layer 82, but is instead positioned within a recess or open cavity 92 formed in upper metal layer 82; e.g., open cavity 92 may be formed in upper metal layer 82 by stamping or etching in an embodiment. Furthermore, the depth of open cavity 92 and the thickness of sintered bond layer 96 are selected such that the upper principal surface of high κ mount pad 94 and the upper principal surface of upper metal layer 82 are substantially flush or coplanar. Such a configuration enables upper metal layer 82 and high κ mount pad 94 to be concurrently contacted by a pressure-applying plate or structure, which may be particularly advantageous in embodiments wherein convergent pressure is applied during sintering and a common sintering process is utilized to form sintered bond layer 96 along with sintered bond layers 88, 90. When metal layers 82, 84, 86 are provided in sheet form, as indicated in FIGS. 8 and 9, other open cavities may likewise be formed at various other locations across the metal sheets corresponding to the other non-illustrated heat sinks produced in parallel with sintered multilayer heat sink 80.

After attaching high κ mount pad 94 and sinter-bonded metal layers 82, 84, 86, the resulting structure (sintered heat sink panel) may be singulated, if needed, to complete fabrication of sintered multilayer heat sink 80 as shown in FIG. 10. Finally, one or more microelectronic devices are attached to sintered multilayer heat sink 80, typically after incorporation of multilayer heat sink 80 into a suitable microelectronic package (not shown). For purposes of illustration, FIG. 10 further depicts two microelectronic devices 98 and 100, which may be mounted to different locations of multilayer heat sink 80 after singulation thereof. As can be seen in FIG. 10, a first microelectronic device 98 (e.g., a first semiconductor die) may be attached to embedded high κ mount pad 94 utilizing, for example, a die attach material or a sintered bond layer similar or identical to sintered bond layers 88, 90, 96. Similarly, a second microelectronic device 100 (e.g., a second semiconductor die) may likewise be attached directly to the upper principal surface of upper metal layer 82 utilizing a die attach material or a sintered bond layer. When incorporated into a microelectronic package, microelectronic devices 98 and 100 may be electrically interconnected to each other, as well as to the package conductors (not shown) utilizing wire bonds or another wiring structure.

There have thus been described embodiments for fabricating multilayer heat sinks utilizing a low temperature sintering process. During the low temperature sintering process, heat, pressure, or a combination of heat and pressure is applied to a multilayer structure to induce sintering of metal (e.g., Ag, Cu, and/or Au) particles distributed between the metal layers as, for example, a paste or film layer. Each multilayer heat sink can be produced as a discrete or freestanding unit, which is not interconnected with other heat sinks during the production process. Alternatively, the multilayer heat sinks can be produced while interconnected in sheet form by bonding multiple metal sheets to yield a multilayer laminate structure or heat sink panel, which is then singulated to yield a plurality of multilayer heat sinks. The sintered metal joints or bond layers can be produced to be essentially free (that is, to contain less than 0.1% by weight and/or 1% by volume) of organic materials. Alternatively, the sintered metal joints or bond layers can be produced to contain organic materials, such as organic binders that serve to increase the strength and/or lower the modulus of the sintered bond layers. The resulting sintered metal (e.g., Cu or Ag-based) bond layers can be produced relatively high thermal conductivities, desired thicknesses, and controlled porosities.

Generally, then, the above-described sinter materials or system utilized to bond metal layers and/or a high κ mount pad can be formulated with or without organic materials, such as binder, which may or may not be transient (that is, which or may not fully decompose during sintering or other thermal treatment). Thus, the final sinter bond layers may contain organic materials in certain implementations, while in other implementations the sinter bond layers may be essentially free of organic materials and may consist essentially of pure metals. The sintered bond layers may or may not have a controlled porosity. The precursor material utilized to form the sintered bond layers may be applied as a paste in certain embodiments, which may then be sintered with or without the application of pressure. Alternatively, the precursor material can be applied as transferred film, which may be adhered to a metal layer (e.g., by the application of slight pressure) during stacking or instead simply placed between two stacked metal layers; the terms "transferred film" and "film transfer" encompassing the physical placement of a freestanding film, as well as a film supported by a backing or other support structure. As before, when applied as a transferred film, the precursory layer be sintered utilizing a pressurized or pressureless sintering process. In still further embodiments, other wet state or dry state application techniques can be employed. The metal layers between which the sintered precursor layer is applied may or may not be plated or coated. For example, in certain embodiments, the metal layers may be plated with Ag, Au, or Cu to enhance bonding with the sintered film or paste. Similarly, the high κ mount pad may or may not be plated. The sintered bond layers produced by sintering of the metal particle-containing precursor layers (again noting that some degree of diffusion into the metal heat sink layers may occur) may have a final thickness ranging from about 5 to about 100 μm and, preferably, a final thickness ranging from about 15 to about 100 μm in an embodiment. In further embodiments, the sintered bond layers may be thicker or thinner than the aforementioned range.

In one embodiment, the heat sink fabrication method includes the step of forming a first metal particle-containing precursor layer over a first principal surface of a first metal layer. The first metal layer and the first metal particle-containing layer are then arranged in a stacked relationship with a second metal layer such that the first metal particle-containing precursor layer is disposed between the first and second metal layers. A low temperature sintering process is then carried-out at a maximum process temperature ($T_{MAX}$) less than the melt point of the metal particles to transform the first metal particle-containing precursor layer into a sintered bond layer joining the first and second metal layers in a sintered multilayer heat sink. The value of $T_{MAX}$ will vary depending upon process parameters (e.g., the application of pressure), the materials employed, and other factors, but may be less than about 300° C. in an embodiment. If the first metal layer and the second metal layer remain in sheet form after the low temperature sintering process such that a heat sink panel is produced pursuant to sintering, singulation may be carried-out to separate the resulting sintered multilayer heat sink from the other heat sinks contained within the heat sink panel.

In another embodiment, the heat sink fabrication method includes the step or process of bonding first and second metal sheets in stacked relationship. An array of mount pads is attached to the first metal sheet prior to, during, or after bonding the first and second metal sheets in stacked relationship. The array of mount pads is attached by: (i) providing metal particle-containing precursor layers at interfaces between the array of mounts pads and the first metal sheet, the metal particle-containing precursor layers containing metal particles having a melt point; and (ii) sintering the metal particle-containing layers at a maximum process temperature less than the melt point of the metal particles to transform the metal particle-containing precursor layers into sintered bond layers bonding mount pads to the first metal sheet. After bonding and attaching, the first and second metal sheets may be singulated to produce a plurality of sintered multilayer heat sinks each containing at least one mount pad.

Embodiments of multilayer heat sinks have further been provided. In one embodiment, the sintered multilayer heat sink includes a first metal layer, a second metal layer, and a sintered bond layer. The first metal layer has a first principal surface and is composed of a first metallic material, while the second metal layer has a second principal surface and is composed of a second metallic material different than the first metallic material. The second metallic material has a thermal conductivity and a coefficient of thermal expansion less than the first metal layer. The sintered bond layer joins the first principal surface of the first metal layer to the second principal surface of the second metal layer. Additionally, in certain embodiments, the multilayer heat sink further includes a mount pad bonded to the first metal layer opposite the second metal layer. When provided, the mount pad may have a thermal conductivity greater than the thermal conductivity of the first metal layer. In certain embodiments, the mount pad may be plated and/or may be attached to the first metal layer by a further sintered bond layer, which may or may not have a composition substantially identical to that of the sintered bond layer jointing the first and second metal layers. In other embodiments, the mount pad may be disposed within an open cavity or trench provided in in the first metal layer such that the mount pad is at least partially embedded within the first metal layer.

While at least one exemplary embodiment has been presented in the foregoing Detailed Description, it should be appreciated that a vast number of variations exist. It should also be appreciated that the exemplary embodiment or exemplary embodiments are only examples, and are not intended to limit the scope, applicability, or configuration of the invention in any way. Rather, the foregoing Detailed Description will provide those skilled in the art with a convenient road map for implementing an exemplary embodiment of the invention. It being understood that various changes may be made in the function and arrangement of elements described in an exemplary embodiment without departing from the scope of the invention as set-forth in the appended claims.

What is claimed is:

1. A method for fabricating one or more sintered multilayer heat sinks, the method comprising:
   forming a first metal particle-containing precursor layer over a first principal surface of a first metal layer, the first metal particle-containing precursor layer containing metal particles having a melt point;
   arranging the first metal layer and the first metal particle-containing layer in a stacked relationship with a second metal layer such that the first metal particle-containing precursor layer is disposed between the first and second metal layers; and sintering the first metal particle-containing layer at a maximum process temperature less than the melt point of the metal particles to produce a sintered bond layer joining the first and second metal layers in a sintered multilayer heat sink.

2. The method of claim 1 wherein the sintered multilayer heat sink remains interconnected with a plurality of additional sintered multilayer heat sinks as a heat sink panel following sintering of the first metal particle-containing layer, and wherein the method further comprises singulating the heat sink panel after sintering to separate the sintered multilayer heat sink from the plurality of additional sintered multilayer heat sinks.

3. The method of claim 1 further comprising selecting the first metal particle-containing precursor layer to contain at least one of the group consisting of silver particles, gold particles, and copper particles.

4. The method of claim 1 further comprising selecting the metal particle-containing precursor layer to contain an organic binder in addition to the metal particles.

5. The method of claim 4 wherein sintering comprise sintering the first metal particle-containing layer under process conditions at which the organic binder decomposes, at least in substantial part, such that the sintered bond layer is essentially free of the organic binder.

6. The method of claim 4 wherein the organic binder comprises an epoxy, and wherein sintering comprises sintering the first metal particle-containing layer under process conditions leaving at least a substantial portion of the epoxy within the sintered bond layer.

7. The method of claim 1 wherein forming comprises applying the first metal particle-containing precursor layer to the first principal surface of the first metal layer utilizing a film transfer process.

8. The method of claim 1 wherein forming comprises dispensing a wet state, flowable first metal particle-containing precursor layer over the first principal surface of the first metal layer to produce the first metal particle-containing precursor layer.

9. A method for fabricating one or more sintered multilayer heat sinks, the method comprising:
forming a first metal particle-containing precursor layer over a first principal surface of a first metal layer, the first metal particle-containing precursor layer containing metal particles having a melt point;
arranging the first metal layer and the first metal particle-containing layer in a stacked relationship with a second metal layer such that the first metal particle-containing precursor layer is disposed between the first and second metal layers;
sintering the first metal particle-containing layer at a maximum process temperature less than the melt point of the metal particles to produce a sintered bond layer joining the first and second metal layers in a sintered multilayer heat sink; and
attaching a microelectronic device to a second principal surface of the first metal layer opposite the first principal surface after sintering the first metal particle-containing layer.

10. The method of claim 1 wherein sintering comprises sintering the first metal particle-containing layer at a maximum process temperature greater than 170 degrees Celsius (° C.) and less than 300° C.

11. The method of claim 1 further comprising attaching a mount pad to the first metal layer, the mount pad having a thermal conductivity greater than the first metal layer.

12. A method for fabricating one or more sintered multilayer heat sinks, the method comprising:
forming a first metal particle-containing precursor layer over a first principal surface of a first metal layer, the first metal particle-containing precursor layer containing metal particles having a melt point;
arranging the first metal layer and the first metal particle-containing layer in a stacked relationship with a second metal layer such that the first metal particle-containing precursor layer is disposed between the first and second metal layers;
sintering the first metal particle-containing layer at a maximum process temperature less than the melt point of the metal particles to produce a sintered bond layer joining the first and second metal layers in a sintered multilayer heat sink; and
attaching a mount pad to the first metal layer, the mount pad having a thermal conductivity greater than the first metal layer by
forming a second metal particle-containing layer at an interface between the mount pad and the first metal layer; and
sintering the second first metal particle-containing layer in conjunction with the first metal particle layer to attach the mount pad to the first metal layer substantially concomitantly with bonding of the first and second metal layers.

13. A method for fabricating one or more sintered multilayer heat sinks, the method comprising:
forming a first metal particle-containing precursor layer over a first principal surface of a first metal layer, the first metal particle-containing precursor layer containing metal particles having a melt point;
arranging the first metal layer and the first metal particle-containing layer in a stacked relationship with a second metal layer such that the first metal particle-containing precursor layer is disposed between the first and second metal layers;
sintering the first metal particle-containing layer at a maximum process temperature less than the melt point of the metal particles to produce a sintered bond layer joining the first and second metal layers in a sintered multilayer heat sink; and
attaching a mount pad to the first metal layer, the mount pad having a thermal conductivity greater than the first metal layer by
positioning the mount pad within an open cavity provided in the first metal layer and exposed at a second principal surface of the first metal layer; and
bonding the mount pad to the first metal level such that a principal surface of the mount pad is substantially coplanar with the second principal surface of the first metal layer.

14. A method for fabricating sintered multilayer heat sinks, the method comprising:
bonding first and second metal sheets in stacked relationship;
attaching an array of mount pads to the first metal sheet prior to, during, or after bonding the first and second metal sheets in stacked relationship, attaching comprising:
providing metal particle-containing precursor layers at interfaces between the array of mounts pads and the first metal sheet, the metal particle-containing precursor layers containing metal particles having a melt point; and sintering the metal particle-containing layers at a maximum process temperature less than the melt point of the metal particles to transform the metal particle-containing precursor layers into sintered bond layers bonding the mount pads to the first metal sheet; and singulating the first and second metal sheets to produce a plurality of sintered multilayer heat sinks each containing at least one mount pad.

15. The method of claim 14 wherein the first metal sheet has a first thermal conductivity, and wherein each mount pad in the array of mount pads has a thermal conductivity exceeding the first thermal conductivity.

16. A method for fabricating sintered multilayer heat sinks, the method comprising:

bonding first and second metal sheets in stacked relationship, wherein a plurality of open cavities is provided in the first metal sheet opposite the second metal sheet;

attaching an array of mount pads to the first metal sheet prior to, during, or after bonding the first and second metal sheets in stacked relationship, attaching comprising:

positioning the array of mount pads in the open cavities provided in the first metal sheet, providing metal particle-containing precursor layers at interfaces between the array of mounts pads and the first metal sheet, the metal particle-containing precursor layers containing metal particles having a melt point, and sintering the metal particle-containing layers at a maximum process temperature less than the melt point of the metal particles to transform the metal particle-containing precursor layers into sintered bond layers bonding the mount pads to the first metal sheet; and singulating the first and second metal sheets to produce a plurality of sintered multilayer heat sinks each containing at least one mount pad.

17. A method for fabricating sintered multilayer heat sinks, the method comprising:

bonding first and second metal sheets in stacked relationship by forming a first metal particle-containing precursor layer between the first and second metal sheets, and sintering the first metal particle-containing precursor layer to bond the first and second metal sheets;

attaching an array of mount pads to the first metal sheet prior to, during, or after bonding the first and second metal sheets in stacked relationship, attaching comprising:

providing further metal particle-containing precursor layers at interfaces between the array of mounts pads and the first metal sheet, the further metal particle-containing precursor layers containing metal particles having a melt point, and sintering the further metal particle-containing layers at a maximum process temperature less than the melt point of the metal particles to transform the further metal particle-containing precursor layers into sintered bond layers bonding the mount pads to the first metal sheet; and singulating the first and second metal sheets to produce a plurality of sintered multilayer heat sinks each containing at least one mount pad.

18. The method of claim 17 further comprising performing a common sintering process to sinter the metal particle-containing layers substantially concurrently with sintering of the further metal particle-containing precursor layer.

19. A sintered multilayer heat sink, comprising:

a first metal layer having a first principal surface and composed of a first metallic material;

a second metal layer having a second principal surface and composed of a second metallic material different than the first metallic material, the second metallic material having a thermal conductivity and a coefficient of thermal expansion less than the first metal layer; and a sintered bond layer bonding the first principal surface of the first metal layer to the second principal surface of the second metal layer.

20. The sintered multilayer heat sink of claim 19 further comprising a mount pad bonded to the first metal layer opposite the second metal layer, the mount pad having a thermal conductivity greater than the thermal conductivity of the first metal layer.

\* \* \* \* \*